(12) United States Patent
Sorg

(10) Patent No.: US 7,126,273 B2
(45) Date of Patent: *Oct. 24, 2006

(54) LED LIGHT SOURCE WITH LENS

(75) Inventor: Jörg Erich Sorg, Pentling (DE)

(73) Assignee: Osram GmbH(DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/854,098

(22) Filed: May 25, 2004

(65) Prior Publication Data

US 2004/0232825 A1 Nov. 25, 2004

Related U.S. Application Data

(60) Division of application No. 10/007,398, filed on Oct. 22, 2001, now Pat. No. 6,759,803, which is a continuation of application No. PCT/DE00/01079, filed on Apr. 7, 2000.

(30) Foreign Application Priority Data

Apr. 22, 1999 (DE) .................. 199 18 370

(51) Int. Cl.
H05B 33/00 (2006.01)

(52) U.S. Cl. ..................... 313/512; 362/800

(58) Field of Classification Search ............... 313/501, 313/512, 498; 362/800
See application file for complete search history.

(56) References Cited

U.S. PATENT DOCUMENTS

| 3,875,456 | A | 4/1975 | Kano et al. |
| 5,043,716 | A | 8/1991 | Latz et al. |
| 5,847,507 | A | 12/1998 | Butterworth et al. |
| 6,155,699 | A | 12/2000 | Miller et al. |
| 6,610,563 | B1 | 8/2003 | Waitl et al. ............. 438/166 |
| 6,759,803 | B1 * | 7/2004 | Sorg ........................ 313/512 |
| 6,946,714 | B1 | 9/2005 | Waitl et al. ............. 257/434 |

FOREIGN PATENT DOCUMENTS

| DE | 196 38 667 A1 | 4/1998 |
| EP | 0 230 336 A1 | 7/1987 |
| EP | 0 854 523 A2 | 7/1998 |
| JP | 62-196878 A | 8/1987 |
| JP | 9-83018 | 3/1997 |
| JP | 10 065 221 A | 3/1998 |
| JP | 10 188 649 A | 7/1998 |
| JP | 2003-124525 A | 4/2003 |
| WO | WO 83/00408 | 2/1983 |

OTHER PUBLICATIONS

Willy Reisen: "Lumineszenz-Dioden—die Leuchtmittel von morgen?" [Light Emitting Diodes—the Light Source of the Future!], Licht, Apr. 1998, pp. 302-304.
Frank Möllmer et al.: "Siemens SMT-TOPLED für die Oberflächenmontage" [Siemens SMT-TOPLED for Surface Mounting], Siemens Components, vol. 29, 1991, No. 4, pp. 147-149.
Frank Möllmer et al.: "Siemens SMT-TOPLED für die Oberflächenmontage" [Siemens SMT-TOPLED for Surface Mounting], Siemens Components, vol. 29, 1991, No. 5, pp. 193-196.

* cited by examiner

Primary Examiner—Ashok Patel
(74) Attorney, Agent, or Firm—Fish & Richardson P.C.

(57) ABSTRACT

The light source has an LED, preferably produced for the surface-mounting technique, embedded in a transparent material filling. A converter substance is integrated in the filling for the at least partial wavelength conversion of the light emitted by the LED. A lens is glued onto the transparent material filling. The material filling has a convex surface and the lens has a concave underside entering into a form fit with the convex surface of the material filling.

16 Claims, 1 Drawing Sheet

LED LIGHT SOURCE WITH LENS

CROSS-REFERENCE TO RELATED APPLICATION

This is a division of U.S. application Ser. No. 10/007,398, filed Oct. 22, 2001 now U.S. Pat. No. 6,759,803, which was a continuation of International Application PCT/DE00/01079, filed Apr. 7, 2000, which designated the United States, and which was not published in English. This application also claims the benefit of German application 199 18 370.8, filed Apr. 22, 1999. All prior applications are herewith incorporated by reference.

BACKGROUND OF THE INVENTION

Field of the Invention

The invention relates to a light source and, more particularly, to an LED light source, with at least one LED, a basic body formed with a recess wherein the LED is arranged, a filling of transparent material which embeds the LED and wherein a converter substance for the at least partial wavelength conversion of the light emitted by the LED is contained, and a lens in contact with the material filling.

LEDs (light-emitting diodes) based on GaN, with which blue or ultraviolet light can be generated, have recently been developed. With the aid of these LEDs, light sources can be produced on the basis of wavelength conversion. A concept, which has already been realized provides that part of the blue light emitted from the LED is converted into yellow light by a suitable converter material, so that white light is generated as a consequence of the resultant color mixing of the original blue light with the converted yellow light. In a second concept, it is proposed to convert ultraviolet light of a suitable LED into the visible spectral range.

The converter material, in the case of both concepts, may either be contained in the semiconductor material of the LED or in an embedding material of resin or the like surrounding the LED.

To increase the radiation intensity of the component in the emission direction, the LED components may be provided with an optical lens, by which the light is focused and emitted in a directed manner.

An example of a form of construction of this type is represented in FIG. 1. There, a form of LED construction is illustrated that is described, for example, in the article "SIEMENS SMT-TOPLED für die Oberflächenmontage" [SIEMENS SMT-TOPLED for surface mounting] by F. Möllmer and G. Waitl in the Journal Siemens Components 29 (1991), issue 4, page 147 in connection with FIG. 1. That form of LED is extremely compact and, if appropriate, allows the arrangement of a large number of LEDs of this type in a linear array or a matrix array.

In the case of a SMT-TOPLED of the configuration shown in FIG. 1, an LED 2 is mounted with one of its electrical contact areas on a leadframe 5, which is connected to one pole of a voltage source, while an opposite leadframe 5, connected to the other pole of the voltage source, is connected by a bonding wire 6 to the other electrical contact area of the LED 2. The two leadframes 5 are encapsulated in a high-temperature-resistant thermoplastic. In this way, a basic body 1, wherein there is a recess 1A into which the LED 2 protrudes from the inside is formed by injection molding. The thermoplastic preferably has a high diffuse reflectance of approximately 90%, so that the light emitted by the LED 2 can be additionally reflected at the sloping side walls of the recess 1A in the direction of the outlet opening. The recess 1A is filled with a transparent resin material 3, such as an epoxy resin, which contains a converter material, for example a suitable dye. The resin material and the thermoplastic are carefully matched with each other, in order that even peak thermal loads do not lead to mechanical problems.

During operation, blue or ultraviolet light is emitted by the LED 2, which may be produced for example on the basis of GaN or on the basis of II–VI compounds. On its path from the LED 2 to the lens 4, the relatively short-wave emitted light radiation is partially converted into longer-wave light radiation in the resin filling 3 containing the converter material. In particular, if a blue LED is used, such a converter material by which the blue light radiation is converted at least partially into yellow light radiation can be used. One problem of this type of construction, however, is that the light rays are subject to different path lengths in the resin filling 3 filled with the converter material from the LED 2 to the lens 4. These have the result that the yellow fraction in the light radiation predominates in the outer region of the component, whereas by contrast, the blue fraction in the light radiation predominates in the center. This effect consequently leads to a color locus of the emitted light radiation varying with the direction of emission or direction of viewing.

U.S. Pat. No. 3,875,456 discloses semiconductor light sources which have two semiconductor elements arranged in a housing or reflector. The semiconductor elements are embedded in a scattering layer, downstream of which there is a covering formed similar to a lens. The scattering layer and the covering may be formed by resin layers applied one on top of the other and contain phosphorescent materials.

U.S. Pat. No. 5,847,507 describes a light-emitting diode wherein the semiconductor element is enveloped by a covering in lens form, for example of epoxy resin, which contains fluorescent materials.

European patent publication EP 0 230 336 shows a component which has a substrate on which an annular spacer and an optoelectronic element are fastened. The optoelectronic element is arranged inside the annular opening. The annular opening is filled with a transparent compound and is closed off by a spherical lens, which is mounted on the annular spacer, lying opposite the substrate, and is in contact with the transparent compound.

SUMMARY OF THE INVENTION

It is accordingly an object of the invention to provide an LED light source, which overcomes the above-mentioned disadvantages of the heretofore-known devices and methods of this general type and wherein the path length of the radiation through the converter material is essentially equal and the light radiation can be emitted in a focused form. In addition, a method of producing a light source of this type is to be specified.

With the foregoing and other objects in view there is provided, in accordance with the invention, a LED light source. The light source contains a basic body having a recess formed therein, and only one LED is disposed in the recess and emits light of a first wavelength. A filling of a transparent material embeds the LED. The transparent material has a converter substance for at least partially converting the light emitted by the LED into light having a second wavelength. The light of the first wavelength and the light of the second wavelength are mixed. A lens is in contact with the filling. The lens has a concave underside, whereby an upper side of the filling enters into a form fit with the concave underside of the lens and has a convex surface formed by the underside of the lens.

In accordance with an added feature of the invention, a volume of the filling is less than a free volume of the recess with the LED disposed therein.

In accordance with an additional feature of the invention, the convex surface of the filling and the underside of the lens are formed to have a substantially constant distance from the LED.

In other words, the filling has a convex upper surface defined by substantially equidistant points from the LED, i.e., it is approximately spherical with the LED forming the center of the sphere.

In accordance with another feature of the invention, the LED has an active radiating area and the convex surface of the filling and the underside of the lens are formed at a substantially constant distance from a geometrical center point of the active radiating area of the LED.

In accordance with a further feature of the invention, the LED is a blue light-emitting LED based on GaN and the converter substance converts light radiation in the blue spectral range into light radiation in the yellow spectral range. In an alternative embodiment, the LED is a UV-emitting LED and the converter substance converts UV light into a visible spectral range.

In accordance with again an added feature of the invention, a distance of the convex surface from the LED is set such that a degree of conversion along an optical path length of the light radiation is substantially 50%.

In accordance with again an additional feature of the invention, the LED has an active radiating area and a distance of the convex surface from a geometrical center point of the active radiating area is set such that a degree of conversion along an optical path length of the light radiation is substantially 50%.

In accordance with again another feature of the invention, the light source is a surface-mounted component.

In accordance with again a further feature of the invention, the filling contains a resin material, in particular an epoxy resin. In a preferred embodiment, also, the basic body contains a thermoplastic material.

In accordance with yet an added feature of the invention, there is provided:

a first leadframe carrying the LED at a first electrical contact area thereof;

a second leadframe connected to a second electrical contact area of the LED by a bond wire; and wherein the basic body is produced by injection molding around the leadframes.

In accordance with yet an additional feature of the invention, the recess is defined by sloping and reflective side walls.

Other features which are considered as characteristic for the invention are set forth in the appended claims.

Although the invention is illustrated and described herein as embodied in LED light source with a lens, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a vertical section through an exemplary prior art embodiment of an LED light source with a lens glued on.

DESCRIPTION OF THE PREFERRED EMBODIMENTS

Figure 1:
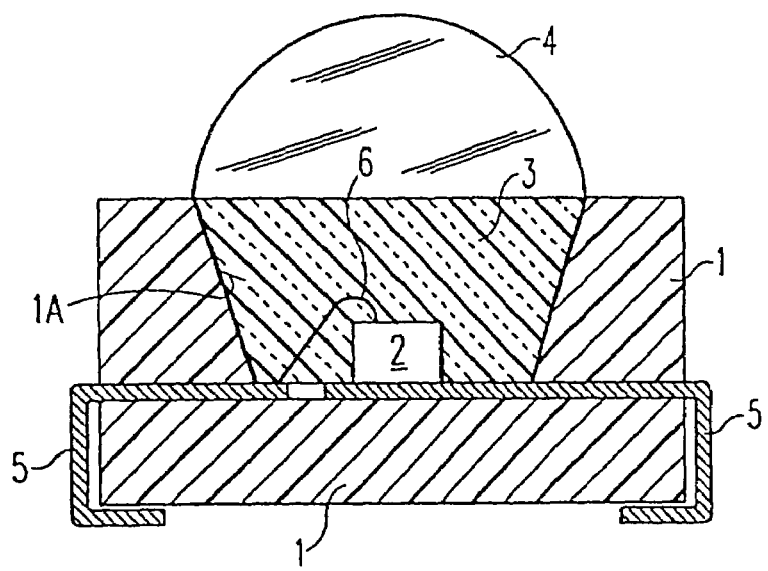
Figure 2:
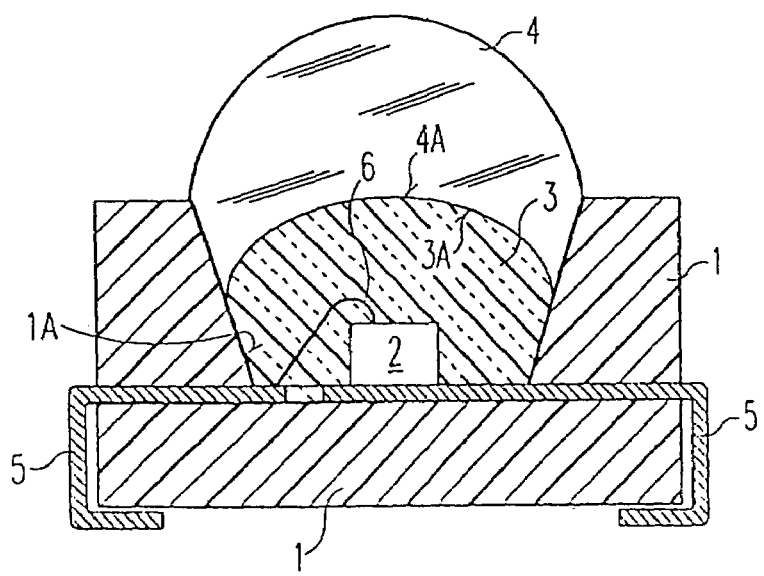
FIG. 2 is a vertical section through an embodiment of an LED light source according to the invention.

Referring now to the figures of the drawing in detail, there is shown in FIG. 2 an embodiment according to the present invention wherein the same reference numerals are allocated for identical and functionally identical elements as in the above description of the light source of FIG. 1. All the advantageous features mentioned with reference to the form of construction of FIG. 1 can also be used in the case of the form of construction according to the invention of FIG. 2.

The light source according to the invention of FIG. 2 solves the stated problem in that the path length of the light radiation in the resin filling 3 is unified. To achieve this, the resin filling 3 is produced with a convex surface 3A, which has essentially the same distance from the LED 2 at every point. The volumetric proportion of the converter material contained in the resin filling is set such that an adequately large fraction of the blue light radiation is converted into yellow light radiation along this unified path length from the LED 2 to the convex surface 3A of the resin filling 3, so that the radiation is perceived by the human eye as white-light radiation. Consequently, on account of the blue-yellow color mixing of the same proportions, at every point of the convex surface 3A white light enters the lens 4 located above it.

The lens 4, produced for example from polycarbonate, has by contrast a concave surface 4A, which enters into a form fit with the convex surface 3A of the resin filling 3.

The light source according to the invention as shown in FIG. 2 can be produced in the following way:

An LED 2 is electrically connected in the way already described to leadframes 5 and the leadframes 5 are encapsulated by a thermoplastic material in such a way that a basic body 1 is formed. The LED 2 is located in a recess 1A of the basic body 1. To this extent, the method has already been described in the above-cited article by Möllmer and Waitl. Then, however, the resin material 3 is not made to fill the recess 1A up to the rim but only up to a precisely fixed filling height below it. Then, a prefabricated lens 4, which has the form shown in FIG. 2 with the concave underside 4A, is inserted into the still liquid resin material 3, the surface of the resin filling coming into contact with the concave underside 4A of the lens 4, so that as a result the convex surface 3A of the resin filling 3 is produced. After the lens 4 has been inserted, the resin filling is cured.

The amount of resin material 3 with which the recess 1A is filled must be set as accurately as possible in such a way that the missing volume up to the rim of the recess 1A corresponds to the displacement volume of the portion of the lens 4 forming the concave underside 4A.

The form of the convex surface 3A of the resin filling 3 and of the concave underside 4A of the lens 4 is already fixed in the production of the lens 4. The condition, which this form has to meet is that the distance of the actual light source, that is the active radiating area of the LED, from these surfaces is constant. For this purpose, the active radiating surface of the LED may be assumed to be punctiform and situated at the center point of the active radiating area.

It should be understood that the present invention is not restricted to the SMT form of construction represented in FIG. 2. For example, the basic body may also be formed by a metallic block, such as a copper block, which has a recess, on the bottom face of which the LED is mounted with one of its electrical contact areas, so that the copper block is at the same time a heat sink and electrical terminal. The other electrical terminal could then be formed on an outer surface of the copper block with an insulating layer lying in between, this electrical terminal being connected to the other contact area of the LED by a bonding wire before the resin filling operation.

I claim:

1. An LED light source, comprising:
   body having a recess formed therein;
   an LED for emitting light of a first wavelength;
   a filling;
   a converter substance for at least partially converting said light emitted by said LED into light having a second wavelength and mixing said light of said first wavelength and said light of the second wavelength; and
   a lens being prefabricated separate from said body and said filling and having a concave underside,
   said LED being disposed in said recess and embedded in said filling,
   said converter substance being contained in said filling,
   said lens being disposed in said recess of said body, and
   said filling having a convex surface being brought into a form fit with said concave underside of said lens by bringing said filling into contact with said concave underside of said lens before the filling is finally cured,
   wherein said convex surface of said filling and said underside of said lens are formed to have a substantially constant distance from said LED.

2. An LED light source, comprising:
   body having a recess formed therein;
   an LED for emitting light of a first wavelength;
   a filling;
   a converter substance for at least partially converting said light emitted by said LED into light having a second wavelength and mixing said light of said first wavelength and said light of the second wavelength; and
   a lens being prefabricated separate from said body and said filling and having a concave underside,
   said LED being disposed in said recess and embedded in said filling,
   said converter substance being contained in said filling,
   said lens being disposed in said recess of said body, and
   said filling having a convex surface being brought into a form fit with said concave underside of said lens by bringing said filling into contact with said concave underside of said lens before the filling is finally cured,
   wherein said LED has an active radiating area and said convex surface of said filling and said underside of said lens are formed at a substantially constant distance from a geometrical center point of said active radiating area of said LED.

3. An LED light source, comprising:
   a body having a recess formed therein;
   an LED disposed in said recess for emitting light of a first wavelength;
   a filling embedding said LED, said filling having a converter substance for at least partially converting the light emitted by said LED into light having a second wavelength, said light of the first wavelength and said light of the second wavelength being mixed; and
   a lens in contact with said filling, said lens having a concave underside, whereby an upper side of said filling enters into a form fit with said concave underside of said lens and has a convex surface fox-rued by said underside of said lens,
   wherein a distance of said convex surface from said LED is set such that a degree of conversion along an optical path length of light radiation is substantially 50%.

4. An LED light source, comprising:
   a body having a recess formed therein;
   an LED disposed in said recess for emitting light of a first wavelength;
   a filling embedding said LED, said filling having a converter substance for at least partially converting the light emitted by said LED into light having a second wavelength, said light of the first wavelength and said light of the second wavelength being mixed; and
   a lens in contact with said filling, said lens having a concave underside, whereby an upper side of said filling enters into a form fit with said concave underside of said lens and has a convex surface formed by said underside of said lens,
   wherein said LED has an active radiating area and a distance of said convex surface from a geometrical center point of said active radiating area is set such that a degree of conversion along an optical path length of light radiation is substantially 50%.

5. An apparatus comprising:
   a body having a recess formed therein;
   an LED disposed in said recess for emitting light of a first wavelength;
   a filling embedding said LED and including a converter substance for at least partially converting the light emitted by said LED into light having a second wavelength, said light of the first wavelength and said light of the second wavelength being mixed when they emerge from the filling; and
   a lens in contact with said filling, said lens having a concave underside,
   wherein said filling is in a fluid state that fills space between said LED and said concave underside of said lens.

6. The apparatus according to claim 5, wherein a volume of said filling is less than a free volume of said recess with said LED disposed therein.

7. The apparatus according to claim 5, wherein said convex surface of said filling and said underside of said lens are formed to have a substantially constant distance from said LED.

8. The apparatus according to claim 5, wherein said LED has an active radiating area and said convex surface of said filling and said underside of said lens are formed at a substantially constant distance from a geometrical center point of said active radiating area of said LED.

9. The apparatus according to claim 5, wherein said LED is a blue light-emitting LED based on GaN and said converter substance is configured to convert light radiation in a blue spectral range into light radiation in a yellow spectral range.

10. The apparatus according to claim 5, wherein said LED is a UV-emitting LED and said converter substance converts UV light into a visible spectral range.

11. The apparatus according to claim 5, wherein said LED is a surface-mounted component.

12. The apparatus according to claim 5, wherein said filling contains a resin material.

13. The apparatus according to claim 5, wherein said body contains a thermoplastic material.

14. The apparatus according to claim 5, which further comprises:
- a first leadframe carrying said LED at a first electrical contact area thereof;
- a second leadframe connected to a second electrical contact area of said LED by a bond wire; and wherein said basic body is produced by injection molding around said first and second leadframes.

15. The apparatus according to claim 5, wherein said recess is defined by sloping and reflective side walls.

16. The apparatus according to claim 5, wherein said filling has a common component extending from the LED to the concave underside of the prefabricated lens.

* * * * *

UNITED STATES PATENT AND TRADEMARK OFFICE
CERTIFICATE OF CORRECTION

| | |
|---|---|
| PATENT NO. | : 7,126,273 B2 |
| APPLICATION NO. | : 10/854098 |
| DATED | : October 24, 2006 |
| INVENTOR(S) | : Jorg Erich Sorg |

It is certified that error appears in the above-identified patent and that said Letters Patent is hereby corrected as shown below:

Title Page
Item [56] Other Publications, "Willy Reisen" publication, third line, Delete "Future!]" Insert --Future?]--

Column 6
Line 4, replace "fox-rued" with --formed--

Signed and Sealed this

Fourth Day of December, 2007

JON W. DUDAS
*Director of the United States Patent and Trademark Office*